(12) United States Patent
Wallace

(10) Patent No.: US 6,739,515 B1
(45) Date of Patent: May 25, 2004

(54) LOW-COST WRITE PROTECT TAB FOR A NON-VOLATILE MEMORY DEVICE

(75) Inventor: Robert F. Wallace, Sunnyvale, CA (US)

(73) Assignee: SanDisk Corporation, Sunnyvale, CA (US)

( * ) Notice: Subject to any disclaimer, the term of this patent is extended or adjusted under 35 U.S.C. 154(b) by 0 days.

(21) Appl. No.: 10/141,710

(22) Filed: May 9, 2002

(51) Int. Cl.[7] ............................................... G06K 19/06
(52) U.S. Cl. ...................................................... 235/492
(58) Field of Search ......................................... 235/492

(56) References Cited

U.S. PATENT DOCUMENTS

| | | | |
|---|---|---|---|
| 4,460,930 A | * 7/1984 | Takahashi | 360/60 |
| 5,210,671 A | 5/1993 | Blackston | 360/133 |
| 5,331,499 A | 7/1994 | Marcusen | 360/133 |
| 5,539,600 A | 7/1996 | Lee et al. | 360/133 |
| 5,828,534 A | * 10/1998 | Lou | 360/132 |
| 6,032,237 A | 2/2000 | Inoue et al. | 711/163 |
| 6,104,561 A | 8/2000 | Braithwaite et al. | 360/60 |
| 6,175,517 B1 | 1/2001 | Jigour et al. | 365/63 |
| 2001/0009505 A1 | 7/2001 | Nishizawa et al. | 361/737 |
| 2003/0064353 A1 | * 4/2003 | Clapper | 434/319 |

* cited by examiner

*Primary Examiner*—Mark Tremblay
(74) *Attorney, Agent, or Firm*—Ritter, Lang & Kaplan LLP

(57) ABSTRACT

Methods and apparatus for write-protecting the contents of a flash memory device are disclosed. According to one aspect of the present invention, a memory storage device includes a memory, and interface, and a housing. The interface is coupled to the memory, and allows the device to communicate or interface with an external device. The housing is arranged around the memory, and includes a first section and a tab that is partially attached to the first section to enable data to be written onto the memory through the interface. The tab is arranged to be detached from the first section to substantially prevent the data from being written onto the memory through the interface. In one embodiment, when the tab is partially attached to the first section, the memory storage device is substantially write-enabled.

22 Claims, 8 Drawing Sheets

LOW-COST WRITE PROTECT TAB FOR A NON-VOLATILE MEMORY DEVICE

BACKGROUND OF THE INVENTION

1. Field of Invention

The present invention relates generally to mass digital data storage systems. More particularly, the present invention relates to systems and methods for protecting the contents of a flash memory device.

2. Description of the Related Art

The use of non-volatile memory systems such as flash memory storage systems is increasing due to the compact physical size of such memory systems, and the ability for non-volatile, or flash, memory to be repetitively reprogrammed. The compact physical size of flash memory storage systems facilitates the use of such storage systems in devices which are becoming increasingly prevalent. Devices which use flash memory storage systems include, but are not limited to, digital cameras, digital camcorders, digital music players, handheld personal computers, and global positioning devices. The ability to repetitively reprogram non-volatile memory included in flash memory storage systems enables flash memory storage systems to be used and reused.

Information that is stored in flash memory may be overwritten when the flash memory is repetitively programmed. For example, information that is written or stored into a given flash memory cell may be overwritten when no available flash memory cells remaining within the flash memory. While overwriting information or data stored in flash memory may be acceptable in some situations, overwriting stored information may be unacceptable in other situations, particularly when the stored information is important or valuable.

In order to prevent data stored in the flash memory of a flash memory storage system such as a flash memory card from being accidentally or inadvertently overwritten, a physical mechanism may be implemented on the flash memory card to substantially prevent information from being stored on the flash memory if the physical mechanism is configured in an appropriate position. A typical mechanism that is used on flash memory cards to prevent the accidental erasure of information stored on the flash memory cards is a write-protect switch. A write-protect switch is typically arranged such that when the write protect switch is in a first position, data may be read from and written to memory in a flash memory card. When the write-protect switch is in a second position, while data may still be read from memory in a flash memory card, data may no longer be written to the memory.

FIG. 1a is a diagrammatic representation of a flash memory card which includes a write-protect switch. For ease of illustration, some features, e.g., input/output pins, have not been shown in FIG. 1a. A memory card 10, as for example a Secure Digital card, has an indentation area 14 on one side. A write-protect switch 12 is arranged to slide within indentation area 14. As shown in FIG. 1a, write-protect switch 12 is in a first position, i.e., a "write" or "write-enabled" position. When write-protect switch 12 is in the first position, when memory card 10 is inserted in a reader, the reader may be used to write or store information onto memory card 10. FIG. 1b is a diagrammatic representation of memory card 10 with write-protect switch 12 positioned in a second position, i.e., a "write-protected" position. In the second position, write-protect switch 12 is arranged to prevent data from being written onto memory card 10.

When memory card 10 is to be accessed by a host device, memory card 10 may be inserted into a reader or an adapter that is either a part of or is coupled to the host device. FIG. 2 is a diagrammatic representation of memory card 10, when memory card 10 is inserted into an adapter. An adapter 22 generally allows information to be read from the memory card. When memory card 10 is not write-protected, then adapter 22 also enables information to be written to memory card 10.

FIG. 3a is a block diagram representation of a memory card, e.g., memory card 10 of FIG. 1a, which is not write-protected and is inserted in an adapter, e.g., adapter 22 of FIG. 2. When write-protect switch 12 is in a write position, contacts 30 associated with adapter 22 make contact with write-protect switch 12. In other words, contacts 30 are effectively arranged to sense when write-protect switch 12 is positioned such that memory card 10 is configured for information to be written onto memory card 10. When contacts 30 are substantially in contact with write-protect switch 12, then adapter may be used to enable information to be written into memory associated with memory card 10.

When write-protect switch 12 is in a write-protected position when inserted into adapter 22, as shown in FIG. 3b, contacts 30 generally fail to come into contact with write-protect switch 12. If contacts 30 effectively do not contact write-protect switch 12, then adapter 22 may not be used to write information into memory associated with memory card 10. By way of example, a computing device which is coupled to adapter 22 may not write information into memory associated with memory card 10 if contacts 22 detect that memory card 10 is write-protected.

While the use of a write-protect switch on a memory card is generally effective in preventing information stored on the memory card from being inadvertently erased or overwritten, costs associated with fabricating write-protect switches as well as costs associated with installing write-protect switches on memory cards may be higher than desired. In addition, since a write-protect switch is typically arranged to slide between a write position and a write-protected position, the write-protect switch may be accidentally slid into a wrong position. For example, when a memory card which has a write-protect switch in a write-protected position is transported, the write-protect switch may be accidentally moved into a write position when contact with another object or surface causes the write-protect to slide. If the write-protect switch on a memory card is accidentally moved into a write position, and a user fails to notice that the memory card is no longer write-protected, then the user may inadvertently overwrite and, hence, lose information that was stored on the memory card. Losing information which was intended to be saved is generally undesirable, particularly when the information is either important or irreplaceable.

Therefore, what is needed is a relatively inexpensive write-protect mechanism which is not likely to be accidentally disengaged. That is, what is desired is a low-cost write-protect mechanism which is effective for write-protecting the contents of a memory card, and substantially may not be accidentally moved from a write-protect configuration to a write configuration.

SUMMARY OF THE INVENTION

The present invention relates to a system and a method for write-protecting the contents of a flash memory device. According to one aspect of the present invention, a memory storage device includes a memory, and interface, and a housing. The interface is coupled to the memory, and allows the device to communicate or interface with an external device. The housing is arranged around the memory, and includes a first section and a tab that is partially attached to the first section to enable data to be written onto the memory through the interface. The tab is arranged to be detached from the first section to substantially prevent the data from being written onto the memory through the interface. In one embodiment, when the tab is partially attached to the first section, the memory storage device is substantially write-enabled. In such an embodiment, when the tab is detached from the first section, the memory storage device is substantially write-protected.

A memory card which includes a write-protect tab enables the contents of memory within the memory card to be protected when the tab is detached. Incorporating a removable write-protect tab into a memory card is relatively inexpensive, when compared to incorporating a write-protect switch. Further, while a write-protect switch may be accidentally toggled or otherwise dislodged from a desired write-protected position, a write-protect tab which is partially attached to the body of a memory card and is arranged to be snapped off of the body substantially eliminates the possibility of accidentally enabling writing to occur on a memory card that is intended to remain write-protected. As such, the contents of the memory within the memory card may be protected with less likelihood of being accidentally erased or overwritten.

According to another embodiment of the present invention, a memory card includes a non-volatile memory, an input/output interface, and a housing. The input/output interface is in communication with the non-volatile memory, and enables the memory storage card to interface with an external device. The housing, which effectively houses the non-volatile memory, includes a body and a tab. The tab is partially attached to the body to enable the memory card to be write-enabled, and is arranged to be detached from the body to enable the memory card to be write-protected.

In one embodiment, when the memory card is interfaced with the external device, the external device makes contact with the tab to determine that data may be written onto the non-volatile memory. In another embodiment, when the tab is detached from the body and the memory card is interfaced with the external device, the external device identifies that the tab is not present. Identifying that the tab is not present may enable the external device to determine that data may not be written onto the non-volatile memory.

According to still another aspect of the present invention, a method for utilizing a memory storage device that has a memory includes storing a first bit into the memory and removing a portion of the memory storage device. Removing the portion of the memory storage device substantially prevents additional bits from being stored into the memory. In one embodiment, when the portion is removed, an indentation is substantially defined in the memory storage device. In such an embodiment, the indentation may be arranged to enable a reader to determine that additional bits are prevented from being stored into the memory when the reader is interfaced with the memory storage device.

These and other advantages of the present invention will become apparent upon reading the following detailed descriptions and studying the various figures of the drawings.

BRIEF DESCRIPTION OF THE DRAWINGS

The invention may best be understood by reference to the following description taken in conjunction with the accompanying drawings in which.

DETAILED DESCRIPTION OF THE EMBODIMENTS

When engaged properly, write-protect switches, which are commonly used to allow the contents stored in the non-volatile memory of a non-volatile memory device to be write-protected, are generally effective in preventing the contents from being inadvertently erased. The write-protect switches, however, may be more expensive to form and install than desired. In addition, the write-protect switches are subject to being accidentally dislodged from an intended position, e.g., a write-protect switch which is in a position to prevent non-volatile memory from being written to or overwritten may be accidentally slid into a position which enables the non-volatile memory to be written to or overwritten. When a write-protect switch is accidentally positioned in a write position, then contents of the non-volatile memory may be inadvertently overwritten.

In lieu of an adjustable write-protect switch, a removable write-protect tab may be implemented on a non-volatile memory device such as a flash memory card. Such a write-protect tab may be arranged to be snapped off to place the memory card in a write-protected state. When the write-protect tab is in place, i.e., not snapped off, then the memory card is in a write-enabled state. By creating the write-protect tab as a component that is substantially integral to the housing of a memory card until the write-protect tab is forcibly snapped off, the costs associated with forming and implementing a slideable switch may be avoided. In other words, since the implementation of a write-protect tab is generally less complicated than the implementation of a slideable write-protect switch, a memory card with a write-protect tab is typically less expensive to manufacture than a memory card with a write-protect switch. Further, since the write-protect tab is snapped off when the memory card is write-protected, it is generally not possible for the write-protected memory card to be accidentally returned to a write-enabled configuration.

Figure 1A:
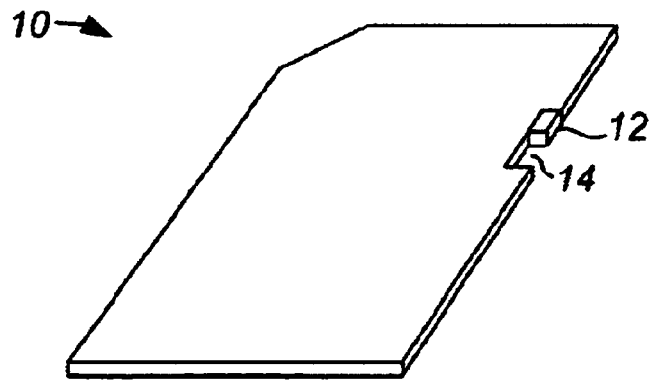
FIG. 1a is a diagrammatic representation of a memory card with a write protect switch in a first position.
Figure 1B:
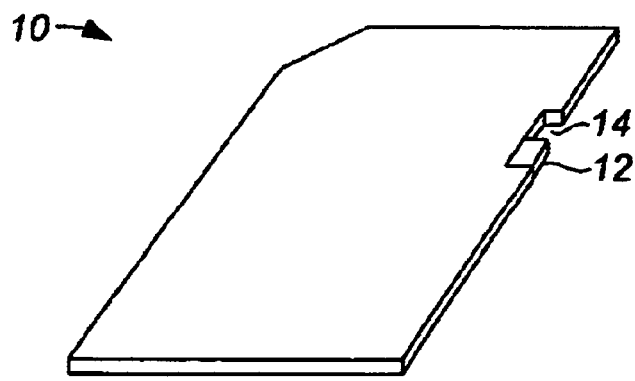
FIG. 1b is a diagrammatic representation of a memory card, i.e., memory card 10 of FIG. 1a, with a write protect switch in a first position.
Figure 2:
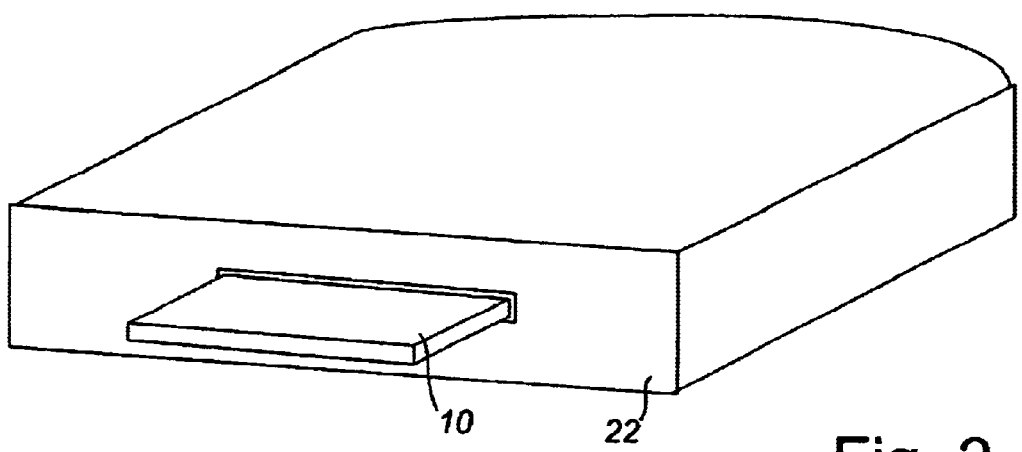
FIG. 2 is a diagrammatic representation of a memory card, i.e., memory card 10 of FIG. 1a, which is interfaced with a reader.
Figure 3A:
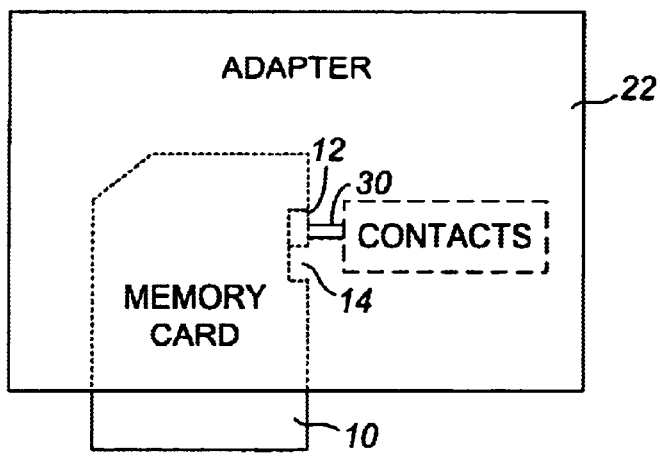
FIG. 3a is a block diagram representation of a memory card, i.e., memory card 10 of FIG. 1a, which is write enabled and inserted into a reader, i.e., reader 22 of FIG. 2.
Figure 3B:
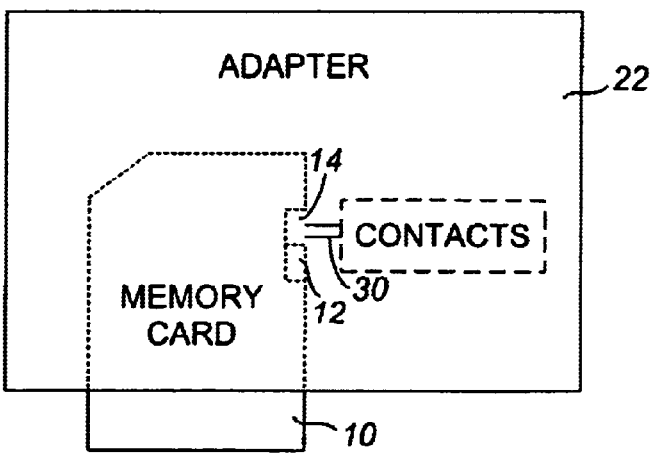
FIG. 3b is a block diagram representation of a memory card, i.e., memory card 10 of FIG. 1a, which is write-protected and inserted into a reader, i.e., reader 22 of FIG. 2.
Figure 4:
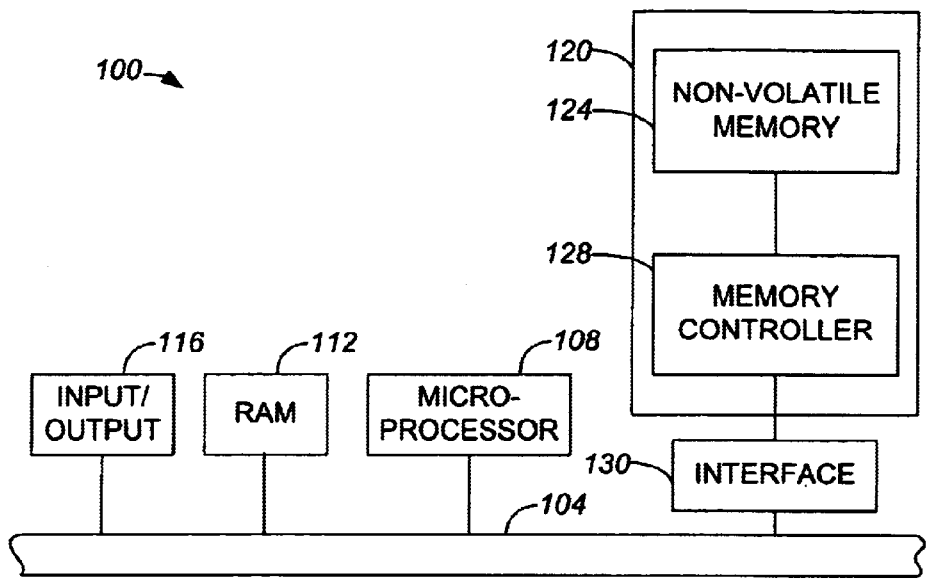
FIG. 4 is a diagrammatic representation of a general host system which includes a non-volatile memory device in accordance with an embodiment of the present invention.

In general, when a non-volatile memory device such as a flash memory card is either to be read from or written to, the non-volatile memory device is interfaced as a part of a host system. Specifically, when the non-volatile memory device is interfaced within a host system, the host system may communicate with the non-volatile memory device to cause bits to be written to, read from, or erased within the non-volatile memory device. Referring initially to FIG. 4, a general host system that includes a non-volatile memory device, e.g., a Secure Digital memory card or a MultiMedia card, will be described. A host or computer system 100 generally includes a system bus 104 which allows a microprocessor 108, a random access memory (RAM) 112, and input/output circuits 116 to communicate. It should be appreciated that host system 100 may generally include other components, e.g., display devices and a networking device, which are not shown for purposes of illustration.

In general, host system 100 may be capable of capturing information including, but not limited to, still image information, audio information, and video image information. Such information may be captured in real-time, and may be transmitted to host system 100 in a wireless manner. While host system 100 may be substantially any system, host system 100 is typically a system such as a digital camera, a video camera, a cellular communications device, an audio player, a video player, or a computer system. It should be appreciated, however, that host system 100 may generally be substantially any system which stores data or information, and retrieves data or information.

Host system 100 may also be a system that either only captures data, or only retrieves data. That is, host system 100 may be a dedicated system which stores data, or host system 100 may be a dedicated system which reads data. By way of example, host system 100 may be a memory writer which is arranged substantially only to write or store data Alternatively, host system 100 may be a device such as an MP3 player which is typically arranged to read or retrieve data, but not to capture data.

A non-volatile memory device 120, in one embodiment, is a removable non-volatile memory device that is typically arranged to interface with bus 104 to store information through an input/output circuit interface 130. Input/output interface 130, which is typically a reader or an adapter, may serve to reduce loading on bus 104, as will be understood by those skilled in the art. In one embodiment, input/output interface 130 includes contacts which are used to determine whether or not non-volatile memory device 120 is write-protected.

Non-volatile memory device 120 includes non-volatile memory 124 and a memory control system 128. In one embodiment, non-volatile memory device 120 may be implemented on a single chip or a die. Alternatively, non-volatile memory device 120 may be implemented on a multi-chip module, or on multiple discrete components which may be used together as non-volatile memory device 120. One embodiment of non-volatile memory device 120 will be described below in more detail with respect to FIG. 5.

Non-volatile memory 124 is arranged to store data such that data may be accessed and read as needed. Data stored in non-volatile memory 124 may also be erased as appropriate, although it should be understood that some data in non-volatile memory 124 may not be erasable. The processes of storing data, reading data, and erasing data are generally controlled by memory control system 128.

Non-volatile memory device 120 has generally been described as including a memory control system 128, i.e., a controller. Often, non-volatile memory device 120 may include separate chips for non-volatile memory 124 and memory control system 128, i.e., controller, functions. By way of example, while non-volatile memory devices including, but not limited to, PC cards, CompactFlash cards, MultiMedia cards, and secure digital cards include controllers which may be implemented on a separate chip, other non-volatile memory devices may not include controllers that are implemented on a separate chip. In an embodiment in which non-volatile memory device 120 does not include separate memory and controller chips, the memory and controller functions may be integrated into a single chip, as will be appreciated by those skilled in the art.

Figure 5:
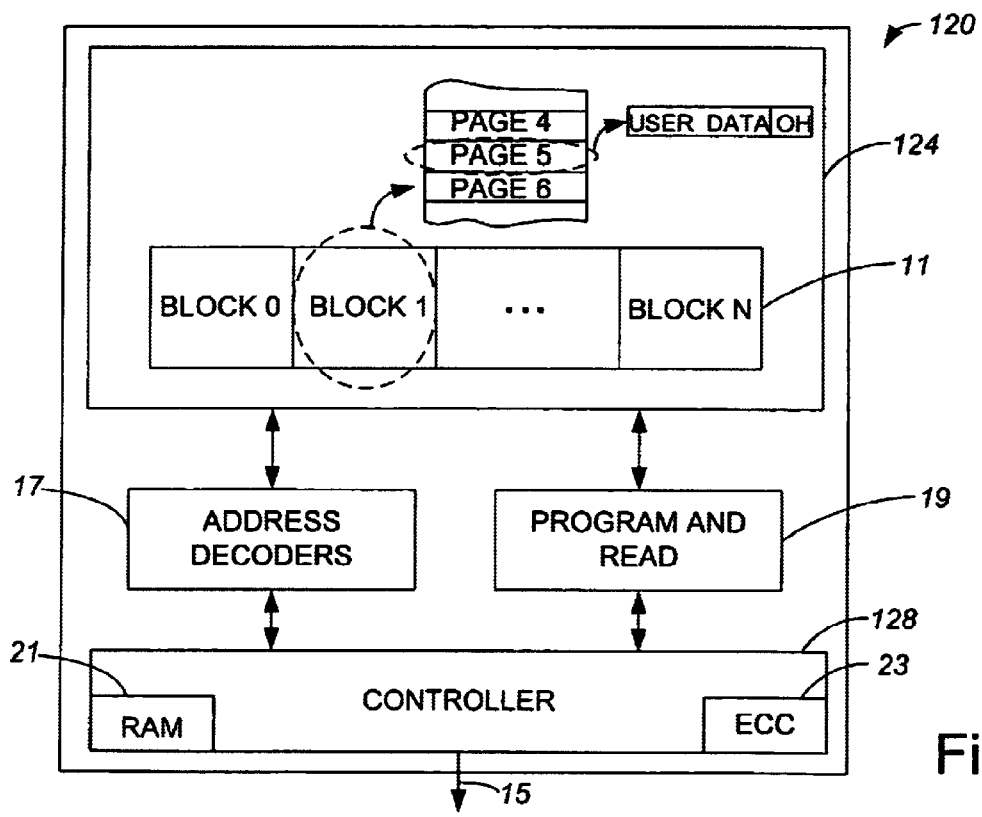
FIG. 5 is a diagrammatic representation of a non-volatile memory device, i.e., nonvolatile memory device 120 of FIG. 4, in accordance with an embodiment of the present invention.

With reference to FIG. 5, non-volatile memory device 120 will be described in more detail in accordance with an embodiment of the present invention. As described above, non-volatile memory device 120 includes non-volatile memory 124 and memory control system 128. Memory 124 and control system 128, or controller, are primary components of non-volatile memory device 120. Memory 124 may be an array of memory cells formed on a semiconductor substrate, wherein one or more bits of data are stored in the individual memory cells by storing one of two or more levels of charge on individual storage elements of the memory cells. A non-volatile flash electrically erasable programmable read only memory (EEPROM) is an example of a common type of memory for such systems.

Control system 128 communicates over a bus 15 to a host computer or other system that is using the memory system to store data. Bus 15 is generally a part of bus 104 of FIG. 4. Control system 128 also controls operation of memory 124, which may include a memory cell array 11, to write data provided by the host, read data requested by the host and perform various housekeeping functions in operating memory 124. Control system 128 generally includes a general-purpose microprocessor which has associated non-volatile software memory, various logic circuits, and the like. One or more state machines are often also included for controlling the performance of specific routines.

Memory cell array 11 is typically addressed by control system 128 through address decoders 17. Decoders 17 apply the correct voltages to gate and bit lines of array 11 in order to program data to, read data from, or erase a group of memory cells being addressed by the control system 128. Additional circuits 19 include programming drivers that control voltages applied to elements of the array that depend upon the data being programmed into an addressed group of cells. Circuits 19 also include sense amplifiers and other circuits necessary to read data from an addressed group of memory cells. Data to be programmed into array 11, or data recently read from array 11, are typically stored in a buffer memory 21 within control system 128. Control system 128 also usually contains various registers for temporarily storing command and status data, and the like.

Array 11 is divided into a large number of BLOCKS 0–N of memory cells. As is common for flash EEPROM systems, the block is the unit of erase. That is, each block contains the minimum number of memory cells that are erased together. Each block is typically divided into a number of pages, as also illustrated in FIG. 4. A page is the unit of programming. That is, a basic programming operation writes data into a minimum of one page of cells. One or more sectors of data are typically stored within each page. As shown in FIG. 5, one sector includes user data and overhead data. Overhead data typically includes an error correction code (ECC) that has been calculated from the user data of the sector. A portion 23 of the control system 128 calculates the ECC when data is being programmed into array 11, and also checks the ECC when data is being read from array 11. Alternatively, the ECCs may be stored in different pages, or different blocks, than the user data to which they pertain.

A sector of user data is typically 512 bytes, corresponding to the size of a sector in magnetic disk drives. Overhead data is typically an additional 28 bytes. One sector of data is most commonly included in each page but two or more sectors may instead form a page. A large number of pages form a block, anywhere from eight pages, for example, up to 512, 1024 or more pages. The number of blocks is chosen to provide a desired data storage capacity for the memory system. Array 11 is typically divided into a few sub-arrays (not shown), each of which contains a proportion of the blocks, which operate somewhat independently of each other in order to increase the degree of parallelism in the execution of various memory operations. An example of the use of multiple sub-arrays is described in U.S. Pat. No. 5,890,192, which is incorporated herein by reference in its entirety.

Figure 6A:
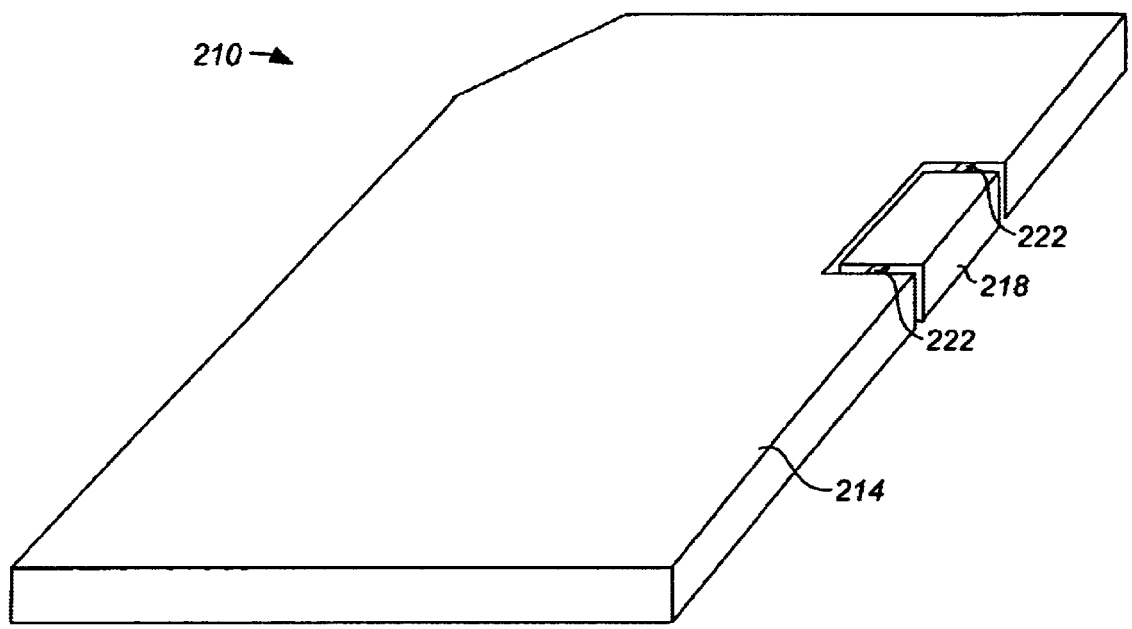
FIG. 6a is a diagrammatic representation of a memory card with a write-protect tab in accordance with an embodiment of the present invention.

As previously mentioned, a non-volatile memory device such as a flash memory card may be formed to include a tab or a piece that is arranged to be detached when a force or a torque is applied. Specifically, the housing of a memory card may be formed to include a tab which is partially attached to the remainder of the housing. FIG. 6a is a diagrammatic representation of a memory card, as for example a Secure Digital card or a MultiMedia card, which includes a partially attached write-protect tab in accordance with an embodiment of the present invention. A memory card 210 includes a housing 214 which has an attached write-protect tab 218, which may be formed from a material such as ABS, polycarbonates, or similar materials. For ease of illustration, various features of memory card 210 are not shown. In addition, memory card 210 and write-protect tab 218 are not drawn to scale. By way of example, the size of write-protect tab 218 relative to memory card 210 has been exaggerated.

Write-protect tab 218 is typically arranged to be molded or otherwise formed as a part of housing 214. Housing 214 is arranged to hold and to substantially protect components of memory card 210, e.g., a circuit board with a non-volatile memory. Write-protect tab 218 is formed such that write-protect tab 218 is substantially connected to the rest of housing 214 through "bridge" pieces 222. In the described embodiment, write-protect tab 218 may be positioned on memory card 210 in substantially the same location as the location the location of a write-protect switch of a conventional memory card when the write-protect switch is in a write-enabled position. As shown, since write-protect tab 218 is coupled to the rest of housing 214, memory card 210 is write-enabled. In other words, memory within memory card 210 may be read from and written into. The presence of write-protect tab 218 is such that contacts associated with a reader or an adapter may substantially make contact with write-protect tab 218, and effectively detect that memory card 210 is write-enabled.

Pieces 222 generally provide a physical coupling between write-protect tab 218 and the rest of housing 214, and may be formed such that with the application of some force, write-protect tab 218 may be substantially detached from the rest of housing 214, e.g., the main body of housing 214. In other words, pieces 222 are arranged to couple write-protect tab 218 to the rest of housing 214, but are substantially weak enough to enable an applied force to effectively detach either write-protect tab 218 from pieces 222, or the rest of housing 214 from pieces 222.

Figure 6B:
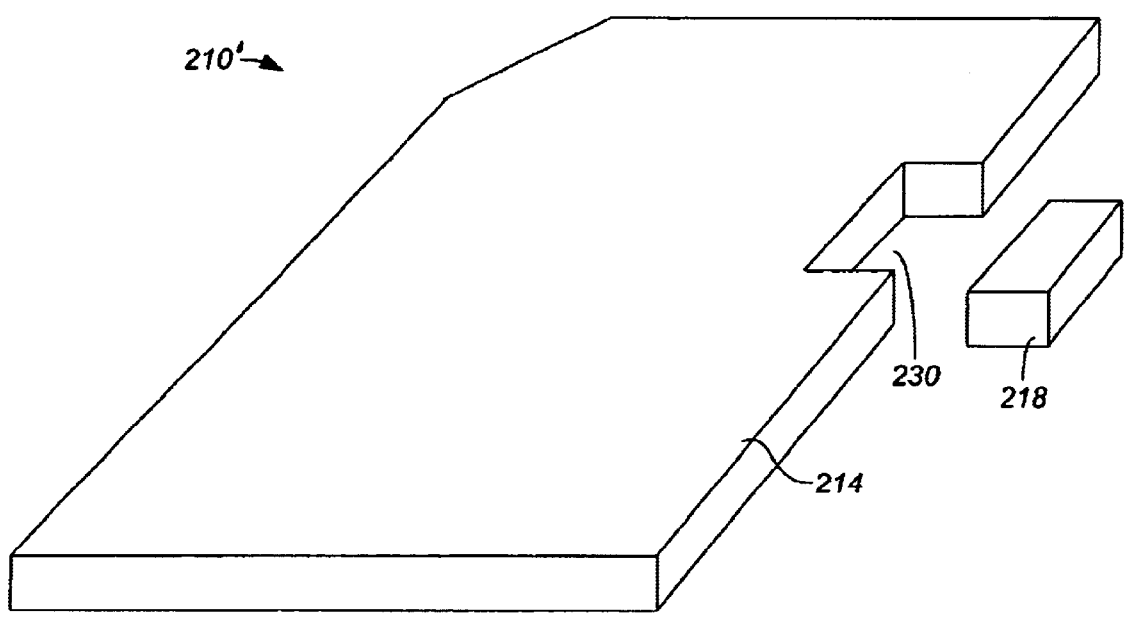
FIG. 6b is a diagrammatic representation of a memory card, i.e., memory card 210 of FIG. 6a, with a removed write-protect tab in accordance with an embodiment of the present invention.

When write-protect tab 218 is removed from the rest of housing 214, as shown in FIG. 6b, then memory card 210' is in a write-protected state. As a result, the contents of memory card 210 may effectively not be overwritten or erased. When memory card 210' is positioned within a reader, contacts which are used to facilitate the determination of whether memory card 210' may be written to effectively do not make contact with any portion of housing 214. Instead, contacts essentially come into contact with space associated with an indentation 230 in housing 214. Hence, since the contacts do not contact write-protect tab 218 or the rest of housing 214, it maybe determined that memory card 210' is write-protected.

Figure 7:
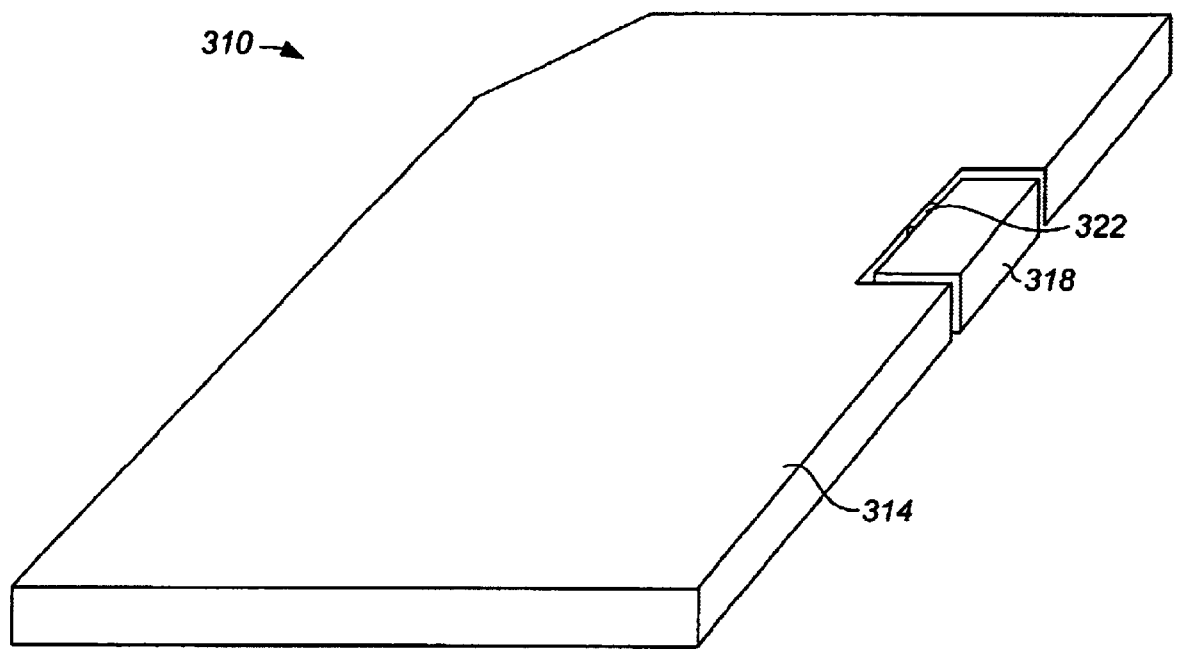
FIG. 7 is a diagrammatic representation of a memory card with a write-protect tab in accordance with another embodiment of the present invention.

In general, the pieces which hold a write-protect tab to the rest of a housing of a memory card may take on substantially any suitable configuration. The configuration and location of the pieces may be determined based upon factors which may include, but are not limited to, the requirements of a particular memory card and manufacturing considerations. As shown in FIG. 6a, pieces 222 maybe located at opposite ends of write-protect tab 218. Alternatively, pieces which hold a write-protect tab to the rest of a housing of a memory card may be located on a single side or end or the write-protect tab, for example. FIG. 7 is a diagrammatic representation of a memory card which includes a write-protect tab in accordance with another embodiment of the present invention. A memory card 310 includes a write-protect tab 318 which is coupled to the remainder of a housing through a single piece 322. When memory card 310 is to be write-protected, a force may be applied to write-protect tab 318 to substantially detach write-protect tab 318 from the rest of housing 314. As shown, write-protect-tab 318 is attached to the rest of housing 314 through a single piece 322.

Figure 8:
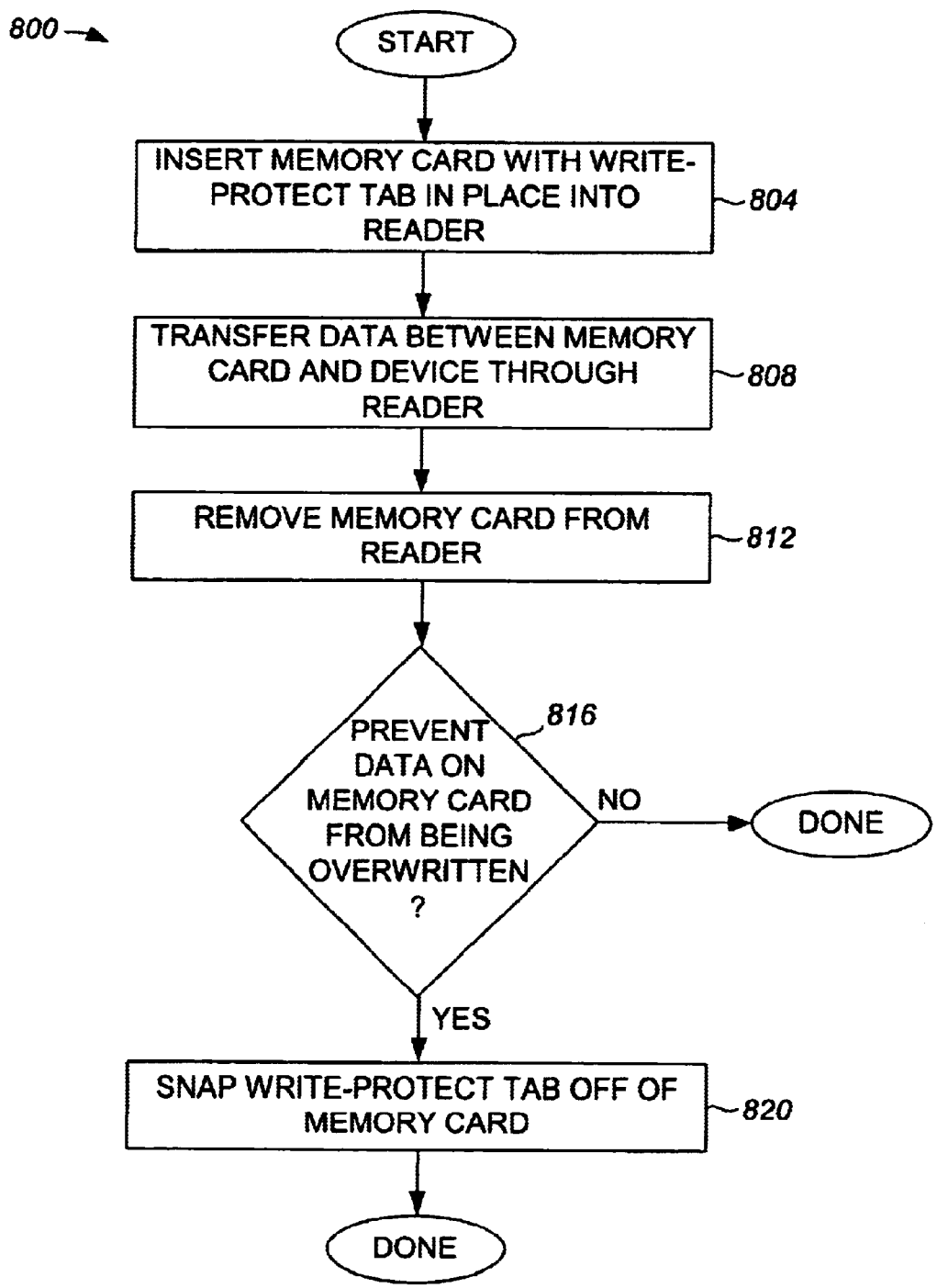
FIG. 8 is a process flow diagram which illustrates the steps associated with write-protecting a memory card which includes a write-protect tab in accordance with an embodiment of the present invention.

With reference to FIG. 8, the steps associated with protecting the contents or information stored in the memory of a memory card which includes a write-protect tab will be described in accordance with an embodiment of the present invention. A process 800 of protecting information begins at step 804 in which a memory card, which has a write-protect tab in place, is inserted into a reader. As will be understood by those skilled in the art, the reader, or adapter, is generally associated with a host device, e.g., a computing system or a digital camera.

Once the memory card is inserted into a reader, data may be transferred between the memory card and the host device through the reader in step 808. Bits provided by the host device may be stored in non-volatile memory on the memory card, or bits may be read from the non-volatile memory and provided to the host device. After the transfer of data is completed, the memory card may be removed from the reader in step 812. A determination may then be made in step 816 as to whether the data stored on the memory card is to be prevented from being overwritten. In other words, it is determined if the data stored on the memory card is to be write-protected.

If the determination is that the data stored on the memory card is not to be write-protected, then the process of protecting information stored on the memory card is completed. Alternatively, if it is determined in step 816 that the data stored on the memory card is to be write-protected, then process flow proceeds to step 820 in which the write-protect tab is snapped off of or otherwise removed from the memory card. Once the write-protect tab is removed from the memory card, then the data stored on the memory card is effectively protected from being overwritten. As such, the process of protecting information stored on the memory card is completed.

Figure 9:
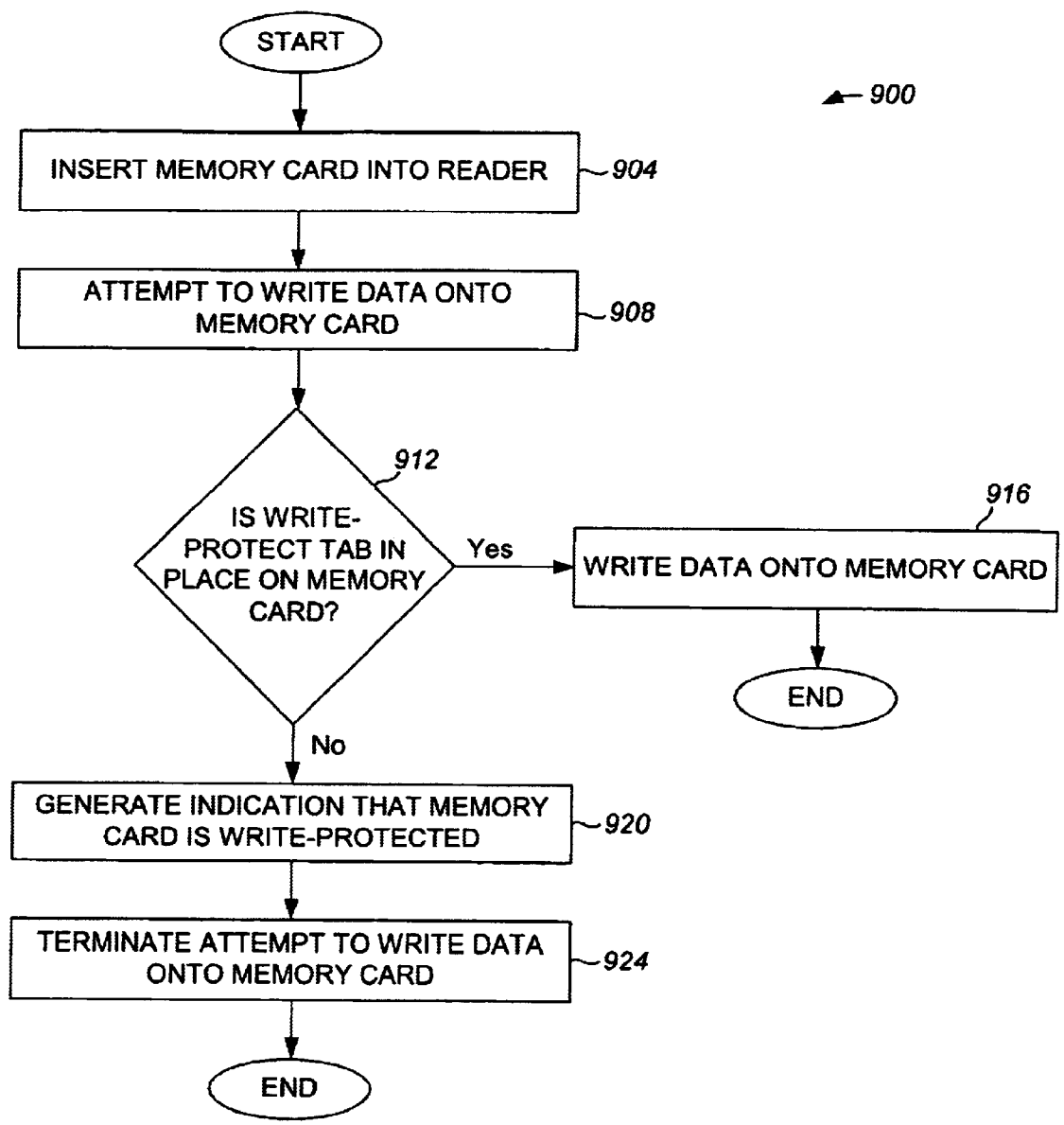
FIG. 9 is a process flow diagram which illustrates the steps associated with using a memory card which is arranged to include a write-protect tab in accordance with an embodiment of the present invention.

When a write-protected memory card, i.e., a memory card from which a write-protect tab has been removed, is inserted into a reader or an interface device, the reader may effectively sense that the write-protected memory card is indeed write-protected. As such, the reader may not be used to write data to the write-protected memory card, although the reader may be used to read data from the write-protected memory card. FIG. 9 is a process flow diagram which illustrates the steps associated with using a memory card which is arranged to include a write-protect tab in accordance with an embodiment of the present invention. A process 900 begins at step 904 with the insertion into a reader of a memory card that is arranged to include a write-protect tab when the memory card is write-enabled. After the memory card is inserted into the reader, an attempt is made in step 908 to write data onto the memory card or, more specifically, into memory associated with the memory card.

In step 912, a determination is made as to whether a write-protect tab is in place on the memory card. If it is determined that a write-protect tab is not in place, then the implication is that the memory card is write-enabled. As such, data is written onto the memory card in step 916, as needed. Once data is written onto the memory card, then the process of using a memory card which is arranged to include a write-protect tab is completed. Alternatively, if it is determined in step 912 that a write-protect tab is not in place on the memory card, then process flow proceeds to step 920 in which an indication is generated which indicates that the memory card is write-protected. In other words, an indication is generated in step 920 which is arranged to inform a user, for example, that the memory card is not write-enabled. Once the indication, which may be a thrown exception or an error message, is generated, the attempt to write data onto the memory card is terminated in step 924.

Although only a few embodiments of the present invention have been described, it should be understood that the present invention may be embodied in many other specific forms without departing from the spirit or the scope of the present invention. By way of example, a write-protect tab may be implemented for use with respect to substantially any type of memory card. In other words, a write-protect tab is not limited for use with respect to a memory card which includes flash memory.

As described above, a write-protect tab may be coupled to the rest of a housing through one or two connecting pieces. In general, however, the number of connecting pieces which are arranged to couple a write-protect tab to the remainder of a memory card housing may vary widely. The location of the connecting pieces may also vary widely, depending upon the requirements of a particular memory card. For instance, manufacturing considerations may effectively require that connecting pieces be oriented in a particular location. Alternatively, force considerations which relate to the amount of force necessary to detach a write-protect tab from the rest of the housing may be accounted for when connecting pieces are positioned.

Typically, once a write-protect tab is detached from the overall housing of a memory card, it is no longer possible for the memory card to be configured as a write-enabled memory card in the future. That is, after the write-protect tab is detached, the write-protect tab may generally not be reattached. It should be appreciated that, in some situations, a memory card from which a write-protect tab has been detached may be reconfigurable, e.g., may be reconfigured to be write-enabled. By way of example, a detached write-protect tab may be arranged such that the write-protect tab may be glued to the overall housing of a memory card in order to render the memory card as write-enabled.

A write-protect tab has generally been described as being arranged to be detached from a housing of a memory card through the application of a force or a torque. Such a force or a torque is generally applied substantially directly by a user, e.g., when the user "snaps" the write-protected off from the remainder of the housing using force or torque applied by his or her fingers. It should be appreciated, however, that substantially any suitable method may be used to remove a write-protect tab from an overall housing. Suitable methods may include, but are not limited to, using pliers to effectively twist a write-protect tab off and using a cutting implement, e.g., scissors or a razor, to cut the write-protect tab off.

The position of a write-protect tab has been shown as being located on one side of a memory card. As will be understood by those skilled in the art, the position of the write-protect tab is typically determined at least in part by the configuration of a reader or interface which interfaces with the memory card. In other words, a write-protect tab is generally positioned such that contacts associated with a reader may effectively sense whether the write-protect tab is present. Hence, the position of a write-protect tab may vary depending upon the orientation and location of contacts within a reader which is arranged to be used with the memory card.

In general, the steps associated with the various processes of the present invention may be widely varied. Steps may be reordered, altered, added, and removed without departing from the spirit or the scope of the present invention. Therefore, the present examples are to be considered as illustrative and not restrictive, and the invention is not to be limited to the details given herein, but may be modified within the scope of the appended claims.

What is claimed is:

1. A memory storage device comprising:
    a memory;
    an interface, the interface being in communication with the memory, the interface being arranged to enable the memory storage device to interface with an external device; and
    a housing, the housing being arranged substantially around the memory, the housing including a first section and a tab, the tab having at least two sides, each of the at least two sides being at least partially attached to the first section to enable data to be written onto the memory through the interface, wherein the tab is arranged to be detached from the first section to substantially prevent the data from being written onto the memory through the interface.

2. The memory storage device of claim 1 wherein when the tab is partially attached to the first section, the memory storage device is substantially write-enabled.

3. The memory storage device of claim 2 wherein when the tab is detached from the first section, the memory storage device is substantially write-protected.

4. The memory storage device of claim 1 wherein when the memory storage device is interfaced with the external device, the external device substantially contacts the tab to substantially determine that data may be written onto the memory.

5. The memory storage device of claim 1 wherein when the tab is detached from the first section, an indentation is substantially defined within the housing.

6. The memory storage device of claim 5 wherein when the memory storage device is interfaced with the external device, the external device substantially recognizes that the tab is not present.

7. The memory storage device of claim 6 wherein when the external device substantially recognizes that the tab is not present, the external device determines that data may not be written into the memory.

8. The method of claim 1 wherein the memory storage device is a memory card and the memory is a non-volatile memory.

9. The method of claim 8 wherein the memory card is one selected from the group consisting of a secure digital card, a Compact Flash card, a multimedia card, a smart media card, and a Memory Stick card.

10. A memory card comprising:

a non-volatile memory;

an input/output interface, the input/output interface being in communication with the non-volatile memory, wherein the input/output interface is arranged to enable the memory storage card to interface with an external device; and a housing, the housing being arranged substantially around the non-volatile memory, the housing including a body and a tab, the tab having at least two sides, the at least two sides each being at least partially attached to the body to enable the memory card to be write-enabled, wherein the tab is arranged to be detached from the body to enable the memory card to be write-protected.

11. The memory card of claim 10 wherein when the memory card is interfaced with the external device, the external device substantially contacts the tab to substantially determine that data may be written onto the non-volatile memory.

12. The memory card of claim 10 wherein when the tab is detached from the body and the memory card is interfaced with the external device, the external device identifies that the tab is not present.

13. The memory card of claim 12 wherein when the external device identifies that the tab is not present, the external device determines that data may not be written onto the non-volatile memory.

14. The memory card of claim 10 wherein the non-volatile memory is flash memory.

15. The memory card of claim 10 wherein the memory card is one selected from the group consisting of a secure digital card, a Compact Flash card, a multimedia card, a smart media card, and a Memory Stick card.

16. A memory storage device comprising:

a memory;

an interface, the interface being in communication with the memory, the interface being arranged to enable the memory storage device to interface with an external device; and a housing, the housing being arranged substantially around the memory, the housing including a first section and a tab having a first side, the first side being partially attached to the first section such that at least a portion of the first side is not attached to the first section, the tab being arranged to enable data to be written onto the memory through the interface, wherein the first side that is partially attached to the first section is arranged to be detached from the first section to substantially prevent the data from being written onto the memory through the interface.

17. The memory storage device of claim 16 wherein when the first side of the tab is partially attached to the first section, the memory storage device is substantially write-enabled.

18. The memory storage device of claim 17 wherein when the first side that is partially attached to the first section is detached from the first section, the memory storage device is substantially write-protected.

19. The memory storage device of claim 16 wherein when the memory storage device is interfaced with the external device, the external device substantially contacts the tab to substantially determine that data may be written onto the memory.

20. The memory storage device of claim 16 wherein when the first side that is partially attached to the first section is detached from the first section, an indentation is substantially defined within the housing.

21. The method of claim 16 wherein the memory storage device is a memory card and the memory is a non-volatile memory.

22. The method of claim 21 wherein the memory card is one selected from the group consisting of a secure digital card, a Compact Flash card, a multimedia card, a smart media card, and a Memory Stick card.

* * * * *